(12) United States Patent
Kirk et al.

(10) Patent No.: US 10,464,001 B2
(45) Date of Patent: Nov. 5, 2019

(54) REMOTE FLUORINATION OF FIBROUS FILTER WEBS

(71) Applicant: 3M INNOVATIVE PROPERTIES COMPANY, St. Paul, MN (US)

(72) Inventors: Seth M. Kirk, Minneapolis, MN (US); Marvin E. Jones, Grant, MN (US); Steven J. Pachuta, Eagan, MN (US); Andrew W. Chen, Woodbury, MN (US); William P. Klinzing, West Lakeland, MN (US); Patrick J. Sager, Hastings, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 268 days.

(21) Appl. No.: 15/357,889

(22) Filed: Nov. 21, 2016

(65) Prior Publication Data
US 2017/0080369 A1 Mar. 23, 2017

Related U.S. Application Data

(63) Continuation of application No. 14/504,514, filed on Oct. 2, 2014, now abandoned, which is a continuation
(Continued)

(51) Int. Cl.
*B01D 39/16* (2006.01)
*B03C 3/30* (2006.01)
(Continued)

(52) U.S. Cl.
CPC ..... *B01D 39/1623* (2013.01); *B01D 46/0032* (2013.01); *B03C 3/28* (2013.01);
(Continued)

(58) Field of Classification Search
CPC ........ B01D 46/0032; B01D 2239/0435; B01D 2239/10; B01D 2239/0622; C23C 16/50;
(Continued)

(56) References Cited

U.S. PATENT DOCUMENTS

| 4,215,682 A | 8/1980 | Kubik |
| 4,264,750 A | 4/1981 | Anand |

(Continued)

FOREIGN PATENT DOCUMENTS

| RU | 2014878 | 6/1994 |
| WO | WO 00/14323 | 3/2000 |

(Continued)

OTHER PUBLICATIONS

Advanced Energy Corporate Fact Sheet Feb. 2009—literature.
(Continued)

*Primary Examiner* — Jeremy R Pierce

(57) ABSTRACT

A method of making a fluorinated fibrous web, which method includes providing a nonwoven web 22 that contains polymeric fibers, creating a plasma that contains fluorine atoms at a first location 14, and contacting the nonwoven web with products from the plasma at a second location 26 remote from the first location 14. The method avoids exposure of the web to the plasma and hence expands the manufacturing processing window. Webs so fluorinated have a different $C_3F_4H^+$ to $C_2F_5^+$ ratio when compared to locally fluorinated webs having similar levels of surface fluorination. The remote fluorinated webs can be subsequently charged electrically to provide a good performing electret filter 40 suitable for use in an air purifying respirator 30. Webs fluorinated in accordance with this invention also may exhibit good performance even after being "aged" at high temperatures.

14 Claims, 4 Drawing Sheets

Related U.S. Application Data of application No. 12/418,290, filed on Apr. 3, 2009, now abandoned.

(51) Int. Cl.

| | | |
|---|---|---|
| *B03C 3/64* | (2006.01) | |
| *B03C 7/00* | (2006.01) | |
| *D06M 10/02* | (2006.01) | |
| *D06M 10/06* | (2006.01) | |
| *B03C 3/28* | (2006.01) | |
| *C23C 16/50* | (2006.01) | |
| *B01D 46/00* | (2006.01) | |

(52) U.S. Cl.
CPC .................. *B03C 3/30* (2013.01); *B03C 3/64* (2013.01); *B03C 7/006* (2013.01); *C23C 16/50* (2013.01); *D06M 10/025* (2013.01); *D06M 10/06* (2013.01); *B01D 2239/025* (2013.01); *B01D 2239/0414* (2013.01); *B01D 2239/0435* (2013.01); *B01D 2239/0622* (2013.01); *B01D 2239/0627* (2013.01); *B01D 2239/10* (2013.01); *B03C 2201/26* (2013.01); *D06M 2200/00* (2013.01); *Y10T 442/2008* (2015.04); *Y10T 442/2475* (2015.04); *Y10T 442/608* (2015.04); *Y10T 442/68* (2015.04)

(58) Field of Classification Search
CPC ......... B03C 7/006; B03C 3/64; Y10T 442/68; Y10T 442/2008; Y10T 442/608
See application file for complete search history.

(56) References Cited

U.S. PATENT DOCUMENTS

| | | |
|---|---|---|
| RE30,782 E | 10/1981 | van Turnhout |
| 4,375,718 A | 3/1983 | Wadsworth |
| RE31,285 E | 6/1983 | van Turnhout |
| 4,508,781 A | 4/1985 | Yagi |
| 4,557,945 A | 12/1985 | Yagi |
| 4,588,537 A | 5/1986 | Klaase |
| 4,590,042 A | 5/1986 | Drage |
| RE32,171 E | 6/1986 | van Turnhout |
| 4,592,815 A | 6/1986 | Nakao |
| 4,828,871 A | 5/1989 | Strobel |
| 4,844,979 A | 7/1989 | Strobel |
| 4,988,533 A | 1/1991 | Freeman |
| 5,025,052 A | 6/1991 | Crater |
| 5,099,026 A | 3/1992 | Crater |
| 5,147,678 A | 9/1992 | Foerch |
| 5,244,780 A | 9/1993 | Strobel |
| 5,307,796 A | 5/1994 | Kronzer |
| 5,401,446 A | 3/1995 | Tsai |
| 5,411,576 A | 5/1995 | Jones |
| 5,472,481 A | 12/1995 | Jones |
| 5,496,507 A | 3/1996 | Angadjivand |
| 5,597,439 A | 1/1997 | Salzman |
| 5,804,295 A | 9/1998 | Braun |
| 5,908,598 A | 6/1999 | Rousseau |
| 6,083,355 A | 7/2000 | Spence |
| 6,116,186 A | 9/2000 | Lie |
| 6,119,691 A | 9/2000 | Angadjavand |
| 6,197,234 B1 | 3/2001 | Goudmand |
| 6,213,122 B1 | 4/2001 | Rousseau |
| 6,214,094 B1 | 4/2001 | Rousseau |
| 6,216,693 B1 | 4/2001 | Rekow |
| 6,238,466 B1 | 5/2001 | Rousseau |
| 6,245,192 B1 | 6/2001 | Dhindsa |
| 6,293,222 B1 | 9/2001 | Paquet |
| 6,375,886 B1 | 4/2002 | Angadjivand |
| 6,397,458 B1 | 6/2002 | Jones |
| 6,398,847 B1 | 6/2002 | Jones |
| 6,406,657 B1 | 6/2002 | Eitzman |
| 6,409,806 B1 | 6/2002 | Jones |
| 6,419,871 B1 | 7/2002 | Ogale |
| 6,432,175 B1 | 8/2002 | Jones |
| 6,454,986 B1 | 9/2002 | Eitzman |
| 6,477,980 B1 | 11/2002 | White |
| 6,562,112 B2 | 5/2003 | Jones |
| 6,627,563 B1 | 9/2003 | Huberty |
| 6,649,222 B1 * | 11/2003 | D'Agostino ............ B05D 1/62 427/212 |
| 6,660,210 B2 | 12/2003 | Jones |
| 6,743,464 B1 | 6/2004 | Insley |
| 6,783,574 B1 | 8/2004 | Angadjivand |
| 6,808,551 B2 | 10/2004 | Jones |
| 6,818,259 B1 | 11/2004 | Koontz |
| 6,819,096 B2 | 11/2004 | Gonzalez |
| 6,824,718 B2 | 11/2004 | Eitzman |
| 6,841,201 B2 | 1/2005 | Shanov |
| 7,005,845 B1 | 2/2006 | Gonzalez |
| 7,161,112 B2 | 1/2007 | Smith |
| 7,214,413 B2 | 5/2007 | Koulik |
| 7,244,291 B2 | 7/2007 | Spartz |
| 7,244,292 B2 | 7/2007 | Kirk |
| 7,245,084 B1 | 7/2007 | Gonzalez |
| 7,445,695 B2 | 11/2008 | Ilic |
| 7,468,494 B2 | 12/2008 | Gonzalez |
| 7,765,698 B2 | 8/2010 | Sebastian |
| 2002/0174869 A1 | 11/2002 | Gahan |
| 2003/0134515 A1 | 7/2003 | David |
| 2006/0062914 A1 | 3/2006 | Garg |
| 2006/0122560 A1 | 6/2006 | Burgmeier |
| 2006/0185594 A1 | 8/2006 | Uehara |
| 2006/0243138 A1 * | 11/2006 | Spartz ................ B01D 39/1623 96/69 |
| 2006/0261525 A1 | 11/2006 | Breister |
| 2006/0265169 A1 | 11/2006 | Breister |
| 2007/0028944 A1 | 2/2007 | Sawin |
| 2007/0117397 A1 | 5/2007 | Fu |
| 2007/0222119 A1 | 9/2007 | Kirk |
| 2008/0026172 A1 | 1/2008 | Stelter |
| 2009/0233387 A1 | 9/2009 | White |
| 2009/0272269 A1 | 11/2009 | Leonard |
| 2010/0252047 A1 | 10/2010 | Kirk |
| 2011/0162653 A1 | 7/2011 | Kirk |
| 2015/0024148 A1 | 1/2015 | Kirk |

FOREIGN PATENT DOCUMENTS

| | | |
|---|---|---|
| WO | WO 2000/65125 | 11/2000 |
| WO | WO 2001/07144 | 2/2001 |
| WO | WO 2003/051969 | 6/2003 |

OTHER PUBLICATIONS

Advanced Energy, *The Art of Choosing the Right Power Supply*, 2008—literature.

Advanced Energy Web Page Information for Litmas® RPS 1501 and 3001 Remote Plasma Source Platform, <http://www.advanced-energy.com/en/Plasma.html>, [retrieved from internet on Jul. 7, 2009].

Chen, Andrew W, *A Study of Fluid Flow Manifolds by Numerical Simulation and Experimentation*, A Dissertation Submitted to the Faculty of the Graduate School of the University of Minnesota, Nov. 16, 2007.

Chen, Andrew W. et al., *Effect of Exit-Port Geometry on the Performance of a Flow Distribution Manifold*, Applied Thermal Engineering, vol. 29, pp. 2689-2692 (2009).

Chen, Andrew W. et al., *Turbulence Modeling for Flow in a Distribution Manifold*, International HJournal of Heat and Mass Transfer, vol. 52, pp. 1573-1581 (2009).

Chen, Andrew W. et al., *Systematic Approaches for Design of Distribution Manifolds Having the Same Per-Port Outflow*, Journal of Fluids Engineering, vol. 131, pp. 061101-1-061101-9 (Jun. 2009).

Foerch, Renate, et al., *Oxidation of Polyethylene Surfaces by Remote Plasma Discharge: A Comparison Study With Alternative Oxidation Methods*, Journal of Polymer Science: Part A. Polymer Chemistry, vol. 28, pp. 193-204 (1990).

(56) References Cited

OTHER PUBLICATIONS

Inagaki, N., et al., *Comparative Studies on Surface Modification of Poly(Ethylene Terephthalate) by Remote and Direct Argon Plasmas*, Journal of Applied Polymer Science, vol. 79, pp. 808-815 (2001).
MKS Astron® Reactive Gas Generators—product literature.
Morse, R.L., *Plasmas*, from Encyclopedia of Physics, second edition, VCH Publishers, Inc., New York, 1991 (no month), pp. 927-931.
Mutel, Brigitte, *Polymer Functionalization and Thin Film Deposition by Remote Cold Nitrogen Plasma Process*, Journal of Adhesion Science and Technology, vol. 22, pp. 1035-1055 (2008).
Park, Y.W., et al., *A New Approach for Selective Surface Modification of Fluoropolymers by Remote Plasmas*, Journal of Applied Polymer Science, vol. 93, pp. 1012-1020 (2004).

\* cited by examiner

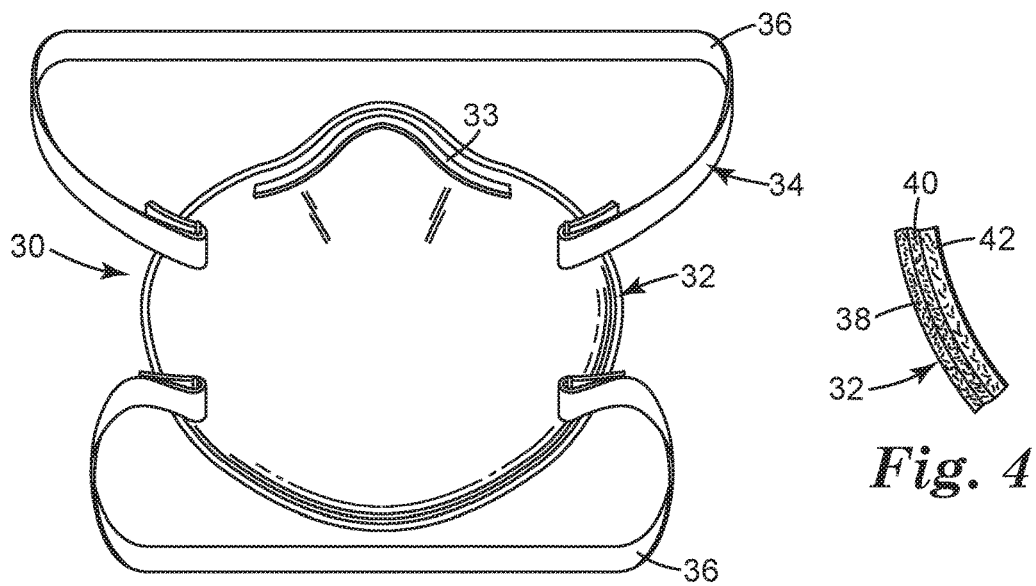
Fig. 3
Fig. 4
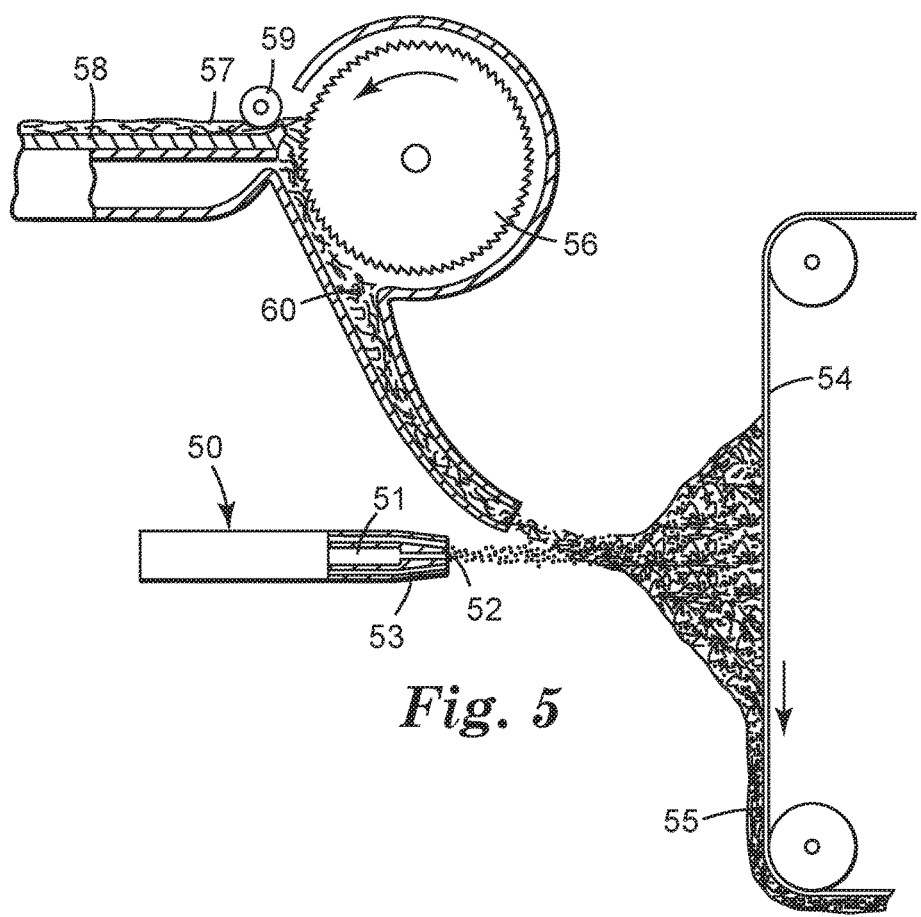
Fig. 5

REMOTE FLUORINATION OF FIBROUS FILTER WEBS

This is a continuation of patent application Ser. No. 14/504,514, filed Oct. 2, 2014, which is a continuation of patent application Ser. No. 12/418,290, filed Apr. 3, 2009 which are incorporated herein by reference.

The present invention pertains to a new method of fluorinating a nonwoven fibrous web. The method uses fluorine-containing plasma products created from a plasma formed at a location remote from a point where the fluorine atoms are transferred to the fibrous web. Webs fluorinated in accordance with the present invention also may be subjected to electrical charging so that they can subsequently be used as electret filters.

BACKGROUND

Electret articles—that is, dielectric articles that exhibit at least quasi-permanent electric charge—are known to exhibit good filtration properties. The articles have been fashioned in a variety of constructions, but for air filtration purposes, the articles commonly take the form of a nonwoven polymeric fibrous web. An example of such a product is the Filtrete™ brand furnace filter sold by the 3M Company. Nonwoven. polymeric electret filters are also used in personal respiratory protection devices—see, for example, U.S. Pat. No. 5,307,796 to Kronzer et al., U.S. Pat. No. 5,804,295 to Braun et al., and U.S. Pat. No. 6,216,693 to Rekow et al.

A variety of methods have been used to make electrets, including fiber/electric particle bombardment (U.S. Pat. No. 4,215,682 to Kubik et al.), direct current "DC" corona charging (see, U.S. Pat. Re. 30,782 and 32,171 to van Turnhout and U.S. Pat. No. 4,592,815 to Nakao), hydrocharging (see, U.S. Pat. Nos. 5,496,507, 6,119,691, 6,375,886, and 6,783,574 to Angadjivand et al., U.S. Pat. No. 6,406,657 to Eitzman et al., and U.S. Pat. No. 6,743,464 to Insley et al.), and from exposure to polar liquids (U.S. Pat. No. 6,454,986 to Eitzman et al.). The electric charge that is imparted to the dielectric article is effective in enhancing particle capture.

During use, electret filters frequently become loaded with particles and contaminants that interfere with the filtering capabilities of the electret filter. Liquid aerosols, for example, particularly oily aerosols, may cause electret filters to lose their electret-enhanced filtering efficiency (see, U.S. Pat. No. 6,627,563 to Huberty).

Numerous methods have been developed to counter this filtering efficiency loss. One method includes adding additional layers of nonwoven polymeric web to the filter. This approach, however, can increase the pressure drop across the electret filter and can add to its weight and bulk. When the electret filter is used in a personal respiratory protection device, these drawbacks can be particularly troublesome. Increased pressure drop, for example, results in increased breathing resistance, making the respirator more uncomfortable to wear.

Another method for improving resistance to oily-mist aerosols, includes adding a melt processable fluorochemical additive such as a fluorochemical oxazolidinone, a fluorochemical piperazine, or a perfluorinated alkane to the polymer during the creation of the polymeric fibrous article—see, for example, U.S. Pat. Nos. 5,025,052 and 5,099,026 to Crater et al. and U.S. Pat. Nos. 5,411,576 and 5,472,481 to Jones et al. The fluorochemicals are melt processable, that is they suffer substantially no degradation under the melt processing conditions that are used to form the fibers in the electret web—see also U.S. Pat. No. 5,908,598 to Rousseau et al. In addition to a melt-processing method, fluorinated electrets also have been made by placing a polymeric article in an atmosphere that contains a fluorine-containing species and an inert gas and then applying an electrical discharge to modify the surface chemistry of the polymeric article. The electrical discharge may be in the form of a plasma such as an AC corona discharge. The plasma fluorination process causes fluorine atoms to become present on the surface of the polymeric article. The fluorinated polymeric article may be electrically charged using, for example, the hydrocharging techniques mentioned above. The plasma fluorination process is described in a number of U.S. patents to Jones/Lyons et al.: U.S. Pat. Nos. 6,397,458, 6,398,847, 6,409,806, 6,432,175, 6,562,112, 6,660,210, and 6,808,551. Other publications that disclose fluorination techniques include: U.S. Pat. Nos. 6,419,871, 6,238,466, 6,214,094, 6,213,122, 5,908,598, 4,557,945, 4,508,781, and 4,264,750; U.S. Publications US 2003/0134515 A1 and US 2002/0174869 A1; and International Publication WO 01/07144. U.S. Pat. No. 7,244,291 to Spartz et al. and U.S. Pat. No. 7,244,292 to Kirk et al. describe fluorinated electret articles that exhibit improved thermal stability.

U.S. Pat. No. 5,147,678 assigned to the University of Western Ontario describes the use of remote plasmas to modify the surfaces of polymeric articles. Remote plasma treatments are different from direct plasma treatments in that the sample surface is positioned away from the plasma creation region. The remote location causes the sample to be exposed to only the longest lived plasma species, which are able to reach the sample, unlike a broader ranger of species that are present in a direct plasma process. Remote $N_2$, $H_2$, and $O_2$ plasmas are used to incorporate nitrogen and oxygen on a polymer surface.

U.S. Pat. No. 6,197,234, assigned to Conte S A, discloses the uses of a remote nitrogen plasma to treat polymeric powders or articles and describes introducing $NF_3$, either upstream or downstream of the plasma zone, to increase "the anti-wettability of a body."

Inagaki, from Shizuoka University in Japan, has authored several publications that describe the use of remote plasma sources to create modified polymer surfaces. One Inagaki article (N. Inagaki, S. Tasaka, and S. Shimada, J. APPL. POLYM. SCI. 79, 808-815 (2001)) describes surface modification of PET film by an argon plasma, and examines the surface modification created as a function of the distance from the "argon plasma zone". Reported surface analysis finds oxygen added to the surface of PET treated in the plasma, but less oxygen added to the surface treated by the remote plasma. Another Inagaki article (Y. W. Park, N. Inagaki, J. APPL. POLYM. SCI. v. 93, pp. 1012-1020 (2004)) describes the surface modification of fluorinated polymer films using remote plasmas fed with Ar, $H_2$, and $O_2$. On three different fluoropolymer substrates (PTFE, ETFE, and PVDF), these remote plasma treatments reduced the surface fluorine concentration and increased the surface oxygen concentration.

A number of additional patents and publications describe plasma devices and methods, including remote plasma fluorination—see, for example, U.S. Pat. Nos. 5,147,678, 6,197,234, 6,477,980, 6,649,222, 6,819,096, 7,005,845, 7,161,112, 7,245,084, 7,445,695, and 7,468,494. U.S. Patent Publication 2007/0028944A1 describes a method of using $NF_3$ and a remote plasma for removing surface deposits. International Publication WO03/051969A2 describes a plasma treatment to fluorinate porous articles. The following non-patent related publications also describe remote plasma techniques:

Renate Foerch et al. *Oxidation of Polyethylene Surfaces by Remote Plasma Discharge: A Comparison Study with Alternative Oxidation Methods*, JOURNAL OF POLYMER SCIENCE: PART A: POLYMER CHEMISTRY, v. 28, pp. 193-204 (1990); N. Inagaki et al., *Comparative Studies on Surface Modification of Poly(ethylene terephthalate) by Remote and Direct Argon Plasmas*, JOURNAL OF APPLIED POLYMER SCIENCE, v. 79, pp. 808-815 (2001); and Brigitte Mutel, *Polymer Functionalization and Thin Film Deposition by Remote Cold Nitrogen Plasma Process*, JOURNAL OF ADHESION SCIENCE AND TECHNOLOGY, v. 22, pp. 1035-1055 (2008).

SUMMARY OF THE INVENTION

Although there are a number of documents that describe the use of remote plasma discharge techniques to fluorinate various articles, there is no known technique for using a remote plasma to deliver fluorine atoms to the surface of a nonwoven web that contains polymeric fibers. Fluorine atoms have been delivered to fibrous webs using plasmas that are created in the presence of the nonwoven web. It was not expected, however, that fluorine atoms could be created at a remote location and then delivered to a fibrous web through a conduit and a distribution means that would allow the fluorine atoms to remain in reactive condition long enough to sufficiently penetrate into the pores of the webs so as to cause the fluorine atoms to be distributed over the fiber surfaces within the interior and exterior of the nonwoven web. Applicants have been able to demonstrate that adequate fluorination can occur using a remote plasma source to enable the resulting product, after being electrically charged, to demonstrate good filtration performance in an oily mist environment. Such good performance can be achieved even after being thermally aged.

The present invention provides a new method of making a fluorinated fibrous web, which method comprises: providing a nonwoven web that contains polymeric fibers; creating a plasma that contains fluorine atoms at a first location; and contacting the nonwoven web with products from the plasma at a second location remote from the first location so as to allow fluorine atoms to be transferred to surfaces of the polymeric fibers.

The present invention also provides a new method of making a nonwoven fibrous electret, which method comprises: fluorinating a nonwoven web, which contains polymeric fibers, with plasma products from a plasma that had been created at a location remote from where the fluorination occurs; and electrically charging the fluorinated nonwoven fibrous web.

The present invention further provides a new electret article that comprises a nonwoven web that comprises melt-blown fibers that contain polypropylene and that have fluorine atoms on the surfaces of the melt-blown fibers in the web such that (a) an atomic % fluorine is greater than 40%, and (b) a ToF-SIMS $C_3F_4H^+$ to $C_2F_5^+$ ratio that is greater than 0.3 and that is above a Remote Fluorination Threshold RFT line for the atomic % fluorine.

Conventional web fluorination techniques have exhibited problems in creating and sustaining a uniform plasma over a large area. The uniformity of the discharge is sensitive to variations in the electrode spacing, variations in the process gas flow, and the variations in the physical characteristics of the product that is being treated. The sensitivity of the discharge to these factors increases as the size of the discharge increases. Using the inventive method, however, a plasma is used to create reactive fluorine-atom-containing species, but the zone where the plasma is created is separated from the zone where the web is exposed to plasma products. This separation of the plasma reaction and the web-treatment zones allows greater process control, by allowing independent optimization of the two reaction processes. One advantage of spatially separating the plasma creation from the web reaction is that the desired uniformity of the delivered treatment is influenced mainly by the distribution of the plasma products and not by electrical distribution of the plasma discharge. When the plasma is made remote from the location of fluorine atom transfer, the manufacturing process window can be expanded because the nonwoven web does not interfere with the plasma creation.

Another advantage of the present invention is that higher power levels can be used in the plasma reaction, allowing more complete disassociation of the fluorine-containing feed gases. In known methods of plasma fluorinating fibrous webs, the higher power levels needed for full disassociation of the reactant gas are more difficult to achieve over a large electrode area. There is no concern for risking damage to the web when it is not present at the location where the plasma is made.

The present invention also is beneficial in that it allows for $NF_3$ use rather than fluorine ($F_2$) gas or fluorocarbons like $C_3F_8$. Surprisingly applicants discovered that nitrogen is not incorporated in the nonwoven web substantially when $NF_3$ is used as the starting material for producing the plasma. The avoidance of fluorinated carbons is particularly beneficial in that their deposits do not need to be cleaned off the plasma fluorination equipment or the fluorinated web.

Articles of the present invention exhibit a different $C_3F_4H^+$ to $C_2F_5^+$ ratio when compared to similar fibrous webs that are locally fluorinated. The $C_3F_4H^+$ to $C_2F_5^+$ ratio is greater in nonwoven webs of the present invention for a given atomic % fluorine. This ratio may be distinguished from known articles using a Remote Fluorination Threshold line described below. Nonwoven webs produced in accordance with the present invention will have a $C_3F_4H^+:C_2F_5^+$ ratio that is above the local fluorination line. Articles of the invention may have a ratio so much greater that it is above a remote fluorination threshold line RFT1, and even may be above a further remote fluorination line RFT2, and even above a still further remote fluorination threshold line RFT3. Thus, the $C_3F_4H^+:C_2F_5^+$ ratio that is manifested under a ToF-SIMS analysis is remarkably distinct from the ratio provided in local fluorination, particularly above atomic % fluorine levels of 40% or greater, more particularly above about 42% atomic fluorine. The inventive nonwoven webs that exhibit such fluorine content have been able to demonstrate good performance after being aged under accelerated conditions.

GLOSSARY

"comprises (or comprising)" means its definition as is standard in patent terminology, being an open-ended term that is generally synonymous with "includes", "having", or "containing". Although "comprises", "includes", "having", and "containing" and variations thereof are commonly-used, open-ended terms, this invention also may be suitably described using narrower terms such as "consists essentially of", which is semi open-ended term in that it excludes only those things or elements that would have a deleterious effect on the fluorinated article, the fluorinated electret, or its method of being produced;

"electret" means a dielectric article that exhibits at least quasi-permanent electric charge:

"electric charge" means that there is charge separation;

"fluorine atoms" means atomic fluorine and/or any molecular fragment or molecule that contains fluorine;

"fluorinated" or "fluorinating" means placing fluorine atoms on the surface of an article;

"manifold" means a device or combination of parts that distributes a fluid;

"heteroatom" means any atom other than carbon, hydrogen, or oxygen, which atom is reactive with fluorine to form a stable bond and includes but is not limited to P, N, B, Si, and S (the heteroatom is considered to be present in the polymeric material if it is above the "background value" as set forth below in "Heteroatom Determination");

"nonwoven" means a structure or portion of a structure in which the fibers or other structural components are held together by a means other than weaving;

"plasma" means an ionized gas. Preferably, "plasma" means a state of matter in which molecules or atoms are effectively ionized allowing charges to flow freely;

"plasma products" or "products of the plasma" mean molecular fragments (and combinations thereof) of the molecules subjected to the plasma;

"polymer" means a material that contains repeating chemical units, regularly or irregularly arranged. Preferably, "polymer" means an organic material that contains repeating linked molecular units or groups that are regularly or irregularly arranged;

"polymeric" and "plastic" each mean a material that mainly includes one or more polymers and may contain other ingredients as well;

"quasi-permanent" means that the electric charge resides in the web under standard atmospheric conditions (22° C., 101,300 Pascals atmospheric pressure, and 50% humidity) for a time period long enough to be significantly measureable;

"remote from" means not at the same place—that is, different from location-wise;

"web" means a structure that is significantly larger in two dimensions than in a third and that is air permeable.

BRIEF DESCRIPTION OF THE DRAWINGS

FIG. 3 is a front perspective view of a disposable respiratory mask 30 that may use electret filter media in accordance with the present invention.

FIG. 4 is a cross-section of the mask body 32 illustrated in FIG. 3, showing a fluorinated fibrous electret filter layer 40.

FIG. 5 is a partial cross-section of an apparatus used for making a nonwoven fibrous web 55 suitable for use in conjunction with the present invention.

DETAILED DESCRIPTION OF PREFERRED EMBODIMENTS

Figure 1:
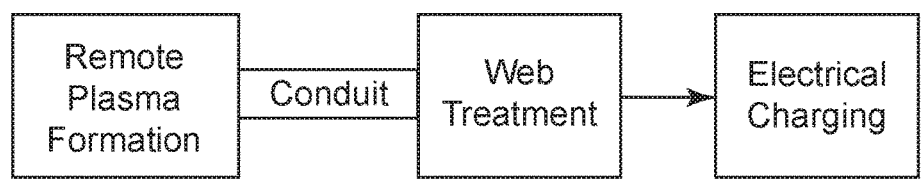
FIG. 1 is a schematic view of a method of making a nonwoven fibrous fluorinated electret web.

FIG. 1 illustrates an example of steps that may be used to make a fibrous nonwoven web that has fluorine atoms on the surface of the fibers. To create such a product, a plasma may be created at a location remote from the fluorine atom delivery chamber. The plasma is used to create a reactive fluorine-atom containing species. As illustrated, the zone where the plasma is created is separate from the zone where the nonwoven web is treated with plasma products. The separation of the plasma reaction from the web treatment zone allows for greater process control. There can be independent optimization of the reactant generation and web treatment steps. Reactive species generation and reaction can be independently optimized. The fluorine delivery chamber also enables improvements in the ability to develop a robustly large area for uniform treatment of nonwoven webs by the fluorinated plasma products. The plasma may be created using known remote plasma sources including Litmas® machines from Advanced Energy industries, Inc. of Fort Collins, Colo. Examples of suitable remote plasma devices from Advanced Energy include the Litmas® RPS1501 and 3001 remote plasma source products. These products are suited to deliver reactive gas species and thus may be used to create fluorine atom-containing plasma products in accordance with the present invention. Other reliable sources for creating fluorine gas species include Astron® plasma machines from MKS Instruments Inc. Once the plasma is created, the plasma products can be delivered via a conduit to the treatment chamber. The treatment chamber preferably is an evacuated chamber into which the nonwoven web-to-be-treated is placed. The plasma products that contain the reactive species enter the chamber whereby rapid reaction occurs with the nonwoven web. At the point where fluorination occurs, there is no longer a plasma glow—that is, there are molecular fragments and combinations of such fragments, which resulted from the plasma but not the plasma itself. The fluorinated web can then be removed from the chamber and subsequently subjected to an electric charging step to create a fluorinated electret nonwoven fibrous web. Electric charging of the nonwoven fibrous web may be carried out using a number of known techniques described below.

Figure 2:
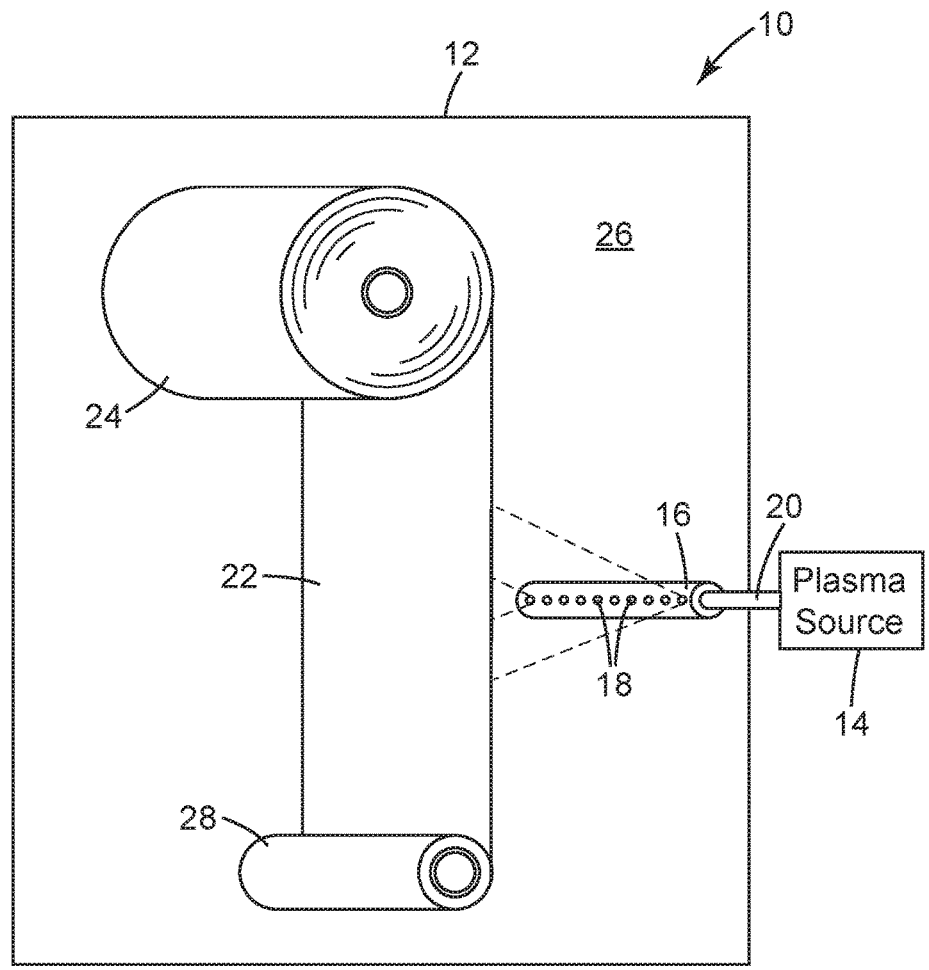
FIG. 2 is a schematic illustration of an apparatus 10 for making a fluorinated nonwoven fibrous fluorinated web 22 in accordance with the present invention.

FIG. 2 schematically illustrates an example of a plasma fluorination system 10 that comprises the treatment chamber 12 and a plasma source 14. Within the treatment chamber 12 is a means 16 for distributing the plasma products, preferably evenly and uniformly across the face of the web. Such a means 16 may include a spray bar or spray head, or other manifold such as a pipe that contains a series of orifices 18 or a slot(s), a showerhead plate, a two or slightly three-dimension array of openings, or any other suitable apparatus that can cause the plasma products to be adequately delivered or evenly distributed across the web face. Typically, the distribution means is spaced about 2 to 30 centimeters from the web. The distribution means traverses the web normal to the web transport direction. The plasma products may be delivered to the chamber 12 at about, for example, 3 cm³ per minute per centimeter (cc/min/cm) of manifold length to about 400 cc/min/cm. The plasma products are delivered from the plasma source 14 to the distribution means 16 via a conduit 20. The conduit 20 may be a simple pipe or a series of pipes and elbows that effectively enable the plasma products to be delivered to the chamber interior 12. The distribution means may be fashioned to have a continuous array of openings, that is a slot, up to about one opening every 8 cm of closed area between openings. The delivery means may be fashioned to have about 0.1 to 1.5 units of inlet area to the total area of the outlet(s). The distribution means may be made from a variety of materials that are suitable to operate in the plasma product environment. Such materials typically are thermally stable and noncorrosive and may be made from aluminum, stainless steel, nickel, fluoropolymers, or other materials suitable to survive the environment and permit the delivery of plasma products to the reactant chamber. Preferably a vacuum system is associated with the chamber 12 to remove molecules from the chamber so that the plasma products react most effectively with the nonwoven web 22. Suction manifolds may be disposed at one or more locations within the vacuum chamber 12 to further manage plasma product flow within the chamber 12. To direct flow through the web, the suction manifold may be disposed in the vicinity of the exposed portion of the web, on a side opposing the plasma product distribution manifold. Web fluorination 22 may be carried out as a bulk operation by delivering a roll 24 of the web to the chamber interior 26. The web 22 can be unwound from the first roll 24 onto a second roll 28 while the plasma products are being delivered from the plasma source 14 to the chamber interior 26 via the conduit 20 and distribution means 16. The exposed web area subject to plasma product impingement between the rolls may be about 0.02 to 10 square meters ($m^2$), more typically 0.1 to 0.5 m. The web speed may be about 1 to 100 meters/minute (m/min), more typically 2 to 30 m/min. Once the complete roll 24 has been unwound from the fresh roll 24 to the second roll 28 and has been adequately exposed to the plasma products during the process of web transport, plasma products delivery to the fluorination chamber 12 may be ceased so that the fluorinated web can be removed from the chamber 12. A new untreated web may then be introduced into the chamber 12 and may be treated in the same manner. Using the method of the present invention, the full width of a nonwoven web can be fluorinated. Webs that are wider than 1 to 2 meters and even greater than 4 meters may be fluorinated in accordance with the present invention. Manifolds used to deliver plasma products to the delivery chamber may have a length similar to the web width. Manifolds used in connection with the present invention may be fashioned to provide a substantially uniform distribution from a pipe that has a linear array of ports. The manifold may be constructed with specific geometric properties, including port-shape orientation and cross-sectional area of the ports and inlet cross-sectional area. See, for example, U.S. Patent Publication 2006-0265169A1, entitled Manifolds for Delivering Fluids Having a Desired Mass Flow Profile and Methods for Designing the Same. For filtering applications, the webs typically are at least 0.25 millimeters (mm) thick and even up to 5 mm or more thick. Very large rolls may be placed within the fluorine delivery chamber. Such rolls may have a diameter of at least about 0.5 meters, and even greater than 3 meters. The total volume of the fluorination chamber may be about 1 to 60 cubic meters ($m^3$), more typically about 4 to 30 $m^3$. The fluorine delivery chamber also may include one or more windows so that the progress of fluorination can be visually examined. This may be accomplished by visually examining the transfer of web 22 from the first roll 24 onto the second roll 28. A suitable alarm or other means may also be used to inform an operator of completion of the fluorination process. The vacuum chamber may further include one or more doors that allow the roll 28 to be removed from the vacuum chamber and to allow another roll 24 to be introduced into the chamber.

Fluorinated electrets are suitable for many filtration applications. Some filters, however, require enhanced thermal stability to meet product specifications, for example, military specifications and NIOSH requirements—see NIOSH, Statement of Standard for Chemical, Biological, Radiological, and Nuclear (CBRN) Air-Purifying Escape Respirator, Attachment A, Sep. 30, 2003 and NIOSH, Statement of Standard for Chemical, Biological, Radiological, and Nuclear (CBRN) Full Facepiece Air Purifying Respirator (APR), Appendix A, Apr. 4, 2003.

The filtering performance of an electret article is commonly characterized using a parameter that is referred to in the art as "quality factor" or "Q value" or "QF". Quality Factor characterizes filtration performance as a blend of the particle penetration and pressure drop parameters. As indicated above, some filters require enhanced thermal stability to meet filtration product specifications. Applications exist where the electret filter media should be resistant to charge degradation at high temperatures. Extraordinary quality factor data can be achieved when testing the inventive electret articles after an accelerated high-temperature aging exposure. Specifically, extraordinary quality factor data can be achieved after 9 hours of storage at 100° C. The Quality Factor that results from this test is referred to as "Q9". Nonwoven webs fluorinated remotely in accordance with the present invention can exhibit increased thermal stability—as measured by the Q9 value. The inventive electret articles thus can maintain good filtration efficiency despite being "aged" at high temperatures for an extended time period.

The higher the Q9 value, at a given flow rate, the better the filtering performance of the electret after high-temperature storage. Electrets of the present invention can have a Q9 value of at least about 1.5/mmH$_2$O, preferably at least about 1.6/mmH$_2$O, more preferably at least about 1.8/mmH$_2$O. Q9 values may be determined according to the test set forth below.

The fluorination process may be performed at less than atmospheric pressure, or under "reduced pressure" and also possibly at atmospheric pressure. The fluorination process is preferably performed in a controlled atmosphere to prevent contaminants from interfering with the addition of fluorine atoms to the surface of the article. The term "controlled" means the apparatus has the ability to control the composition of the atmosphere in the chamber where fluorination occurs. The atmosphere preferably is substantially free of oxygen and other undesired components. The atmosphere typically contains less than 1% oxygen or other undesired components, preferably less than 0.1%, by volume.

The fluorine containing species present in the atmosphere can be derived from fluorinated compounds that are gases at room temperature, that become gases when heated, or that are capable of being vaporized. Examples of useful sources of fluorine-containing species include fluorine atoms, elemental fluorine, inorganic fluorides such as fluorinated sulfur (e.g., $SF_6$), fluorinated nitrogen (e.g., $NF_3$), and $PF_3$, $BF_3$, $SiF_4$, and combinations thereof. The atmosphere of fluorine containing species can also include inert diluent gases such as the noble gases helium, argon, etc., and combinations thereof. Nitrogen can also be used as a diluent.

The electrical discharge that is created during plasma formation is capable of creating a variety of fluorine containing species. The plasma may be in the form of, e.g., glow discharge plasma, corona plasma, silent discharge plasma (also referred to as dielectric barrier discharge plasma and alternating current ("AC") corona discharge), and hybrid plasma, e.g., glow discharge plasma at atmospheric pressure, and pseudo glow discharge—see U.S. Pat. Nos. 6,808,551, 6,660,210, 6,562,112, 6,432,175, 6,409,806, 6,398,847 and 6,397,458 to Jones/Lyons et al. Preferably, the plasma is an AC plasma at reduced pressure. "Reduced pressure" means pressure less than 700 Pa, preferably less than 140 Pa. Examples of useful surface modifying electrical discharge processes are described in U.S. Pat. Nos. 5,244,780, 4,828,871, and 4,844,979 to Strobel et al.

The fluorine surface concentration may be ascertained using electron spectroscopy for chemical analysis (ESCA), also known as X-ray photoelectron spectroscopy or XPS. The surface of the inventive electret articles exhibits greater than about 40 atomic % fluorine, more typically greater than about 45 atomic % fluorine when analyzed by XPS. XPS analyzes the elemental composition of the outermost surface (i.e., approximately 30 to 100 Å) of a specimen. The electret article also has a fluorosaturation ratio (FSR) at the surface of the electret in a range of about 270 to about 413. The fluorosaturation ratio, FSR, can be determined by dividing the atomic percent fluorine of a sample by its saturated/unsaturated ratio. The atomic percent fluorine and the saturated/unsaturated ratio may be determined using XPS and ToF-SIMS procedures described below. See U.S. Pat. No. 7,244,291 to Spartz et al. The electret articles also do not possess any heteroatoms on the surface of the fibers. Heteroatom evaluation may be carried out according to the "Heteroatom Determination" technique set forth in U.S. Pat. No. 7,244,292 to Kirk et al. at column 15, lines 17-61.

The $C_3F_4H^+$ to $C_2F_5^+$ ratio is measured using Time of Flight Secondary ion Mass Spectrometry (ToF-SIMS) as described below. The ratio of $C_3F_4H^+$ to $C_2F_5^+$ for the inventive articles is at least about 0.3, and more typically is at least about 0.4. This ratio also is above the Remote Fluorination Threshold (RFT1) line illustrated in FIG. 7. The RFT1 line is defined by the equation (1) set forth in the Examples below. The $C_3F_4H^+$ to $C_2F_5^+$ ratio may also be above the RFT2 line, and more preferably above the RFT3 line. The RFT2 and RFT3 lines are defined by the equations (2) and (3), respectively, in the Examples section below.

Fibrous webs suitable for use in this invention can be made from a variety of techniques, including air laid processes, wet laid processes, hydro-entanglement, spun-bond processes, and melt blown processes such as described in Van A. Wente, *Superfine Thermoplastic Fibers*, 48 INDUS. ENGN. CHEM. 1342-46 and in Report No. 4364 of the Naval Research Laboratories, published May 25, 1954, entitled *Manufacture of Super Fine Organic Fibers* by Van A. Wente et al. The fibrous webs can be made using combinations of these techniques and combinations of such fibers. Microfibers, particularly meltblown microfibers, are particularly suitable for use in fibrous webs that are used as filters. As used in this document, "microfiber" means fiber(s) that have an effective diameter of about 35 micrometers or less. Effective fiber diameter can be calculated using equation number 12 in Davies, C. N., *The Separation of Airborne Dust and Particles*, INST. MECH. ENGN., LONDON PROC. 1B (1952). For filtering applications, the microfibers typically have an effective fiber diameter of less than 20 micrometers, more typically, about 1 to about 10 micrometers. Fibers made from fibrillated films may also be used—see, for example, U.S. Pat. RE30,782, RE32,171, U.S. Pat. Nos. 3,998,916 and 4,178,157 to Van Turnout. Nonwoven webs that are made by the process of the present invention may exhibit quality factors QF that exceed 2, 2.1, 2.2, and 2.3.

Staple fibers also may be combined with the microfibers to improve web loft, that is, to reduce its density. Reducing web density can lower the pressure drop across the web, making it easier for air to pass through the filter. Lower pressure drops are particularly desirable in personal respiratory protection devices because they make the respirator more comfortable to wear. When the pressure drop is lower, less energy is needed to draw air through the filter. A respirator wearer who dons a negative pressure mask—that is a respirator that requires negative pressure from the wearer's lungs to draw air through the filter—does not have to work as hard to breathe filtered air. Lower energy requirements also can be beneficial in powered filtering systems to reduce costs associated with powering the fan and to extend the service life of a battery in a battery powered system. In a typical nonwoven fibrous filter, no more than about 90 weight percent staple fibers are present, more typically no more than about 70 weight percent. Often, the remainder of the fibers are microfibers. Examples of webs that contain staple fibers are disclosed in U.S. Pat. No. 4,118,531 to Hauser.

Active particulate also may be included in webs for various purposes, including sorbent purposes, catalytic purposes, and others. U.S. Pat. No. 5,696,199 to Senkus et al., for example, describes various types of active particulate that may be suitable. Active particulate that has sorptive properties—such as activated carbon or alumina—may be included in the web to remove organic vapors during filtration operations. The active particulate may be present in the web at amounts up to about 95 volume percent. Examples of particle-loaded nonwoven webs are described, for example, in U.S. Pat. No. 3,971,373 to Braun, U.S. Pat. No. 4,100,324 to Anderson, and U.S. Pat. No. 4,429,001 to Kolpin et al.

Polymers that may be suitable for use in producing nonwoven fibrous webs suitable for electrets include thermoplastic organic nonconductive polymers. These polymers are generally capable of retaining a high quantity of trapped charge and are capable of being processed into fibers, such as through a melt-blowing apparatus or a spun-bonding apparatus. The term "organic" means that the backbone of the polymer comprises carbon atoms. Preferred polymers include polyolefins, such as polypropylene, poly-4-methyl-1-pentene, blends or copolymers containing one or more of these polymers, and combinations of these polymers. Other polymers may include polyethylene, other polyolefins, perfluoropolymers, polyvinylchlorides, polystyrenes, polycarbonates, polyethylene terephthalate, other polyesters, such as polylactide, naturally occurring polymers, and combinations of these polymers and optionally other nonconductive polymers.

The fibrous electrets used in connection with the present invention also may be extruded or otherwise formed to have multiple polymer components—see U.S. Pat. No. 4,729,371 to Krueger and Dyrud and U.S. Pat. Nos. 4,795,668, and 4,547,420 to Krueger and Meyer. The different polymer components may be arranged concentrically or longitudinally along the length of the fiber to create, for example, a bicomponent fiber. The fibers may be arranged to form a "macroscopically homogeneous" web, namely, a web that is made from fibers that each have the same general composition.

Fibers made from polymeric materials also may contain other suitable additives. Possible additives include thermally stable organic triazine compounds or oligomers, which compounds or oligomers contain at least one nitrogen atom in addition to those in the triazine ring—see U.S. Pat. Nos. 6,268,495, 5,976,208, 5,968,635, 5,919,847, and 5,908,598 to Rousseau et al. Another additive known to enhance electrets charged by jets of water is Chimassorb™ 944 LF (poly[[6-(1,1,3,3-tetramethylbutyl) amino]-s-triazine-2,4-diyl][[(2,2,6,6-tetramethyl-4-piperidyl) imino] hexamethylene [(2,2,6,6-tetramethyl-4-piperidyl) imino]]), available from Ciba Specialty Chemicals, Inc. The additives may be N-substituted amino aromatic compounds, particularly triamino substituted compounds that are, for example, of the formulas (1) or (2) set forth below:

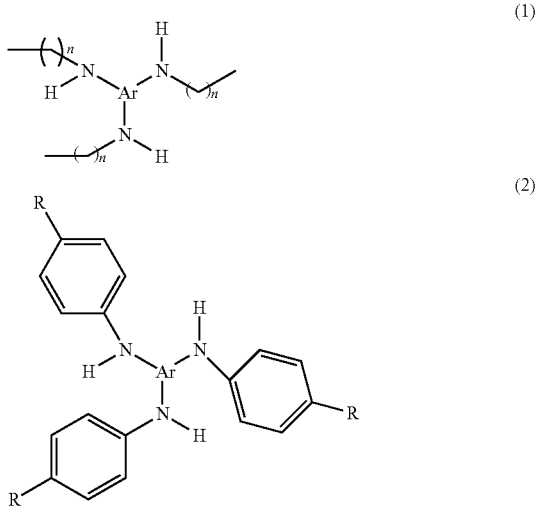

where Ar is a trivalent aromatic group substituted by zero to 3 nitrogen atoms, n is an integer of 1 to 20, and each R independently may be a group that has less than about 20 non-hydrogen non-metal atoms. Each R, for example, may independently be: hydrogen; halogen, for example, fluorine; hydroxyl; alkyl having up to 20 carbon atoms, for example methyl, ethyl, propyl, butyl, etc; halogen substituted alkyls such as trifluoromethyl; alkoxy having 1 to 20 carbon atoms such as methoxy; ester having 2 to 20 carbon atoms such as methoxycarbonyl; substituted amines that contain 2 to 20 carbon atoms such as methylamino; and nitro. Further examples of charge-enhancing additives are provided in U.S. Patent Application Ser. No. 61/058,029, entitled Charge-Enhancing Additives For Electrets and U.S. Patent Application Ser. No. 61/058,041, entitled Electret Webs With Charging-Enhancing Additives. Typically, the additives are present in the polymeric article at about 0.1 to 5% by weight, more typically at about 0.25 to 2% by weight.

Other additives include light stabilizers, primary and secondary antioxidants, metal deactivators, hindered amines, hindered phenols, fatty acid metal salts, triester phosphites, phosphoric acid salts, fluorine-containing compounds, melamines, and the additives mentioned in U.S. Pat. No. 7,390,351 to Leir et al., U.S. Pat. No. 5,057,710 to Nishiura et al., Japanese Publication No. 2002-212439, Japanese Publication No. 2005-131485.

Fibers that contain additives can be quenched after shaping a heated molten blend of the polymer and additive—followed by annealing and charging steps—to create an electret article. Enhanced filtration performance may be imparted to the article by making the electret in this manner—see U.S. Pat. No. 6,068,799 to Rousseau et al. The electret articles also can be made to have a low level of extractable hydrocarbon (<3.0 weight %) to improve loading performance—see U.S. Pat. No. 6,776,951 to Rousseau et al.

The polymeric material that is used to produce a fibrous electret according to the inventive method may have a volume resistivity of $10^{14}$ ohm·cm or greater at room temperature. The volume resistivity may also be about $10^{16}$ ohm·cm or greater. Resistivity of the polymeric fiber-forming material can be measured according to standardized test ASTM D 257-93. The polymeric fiber-forming material used to make the fibrous electrets such as the melt blown fibers also should be substantially free from components such as antistatic agents, which agents could increase the electrical conductivity or otherwise interfere with the ability of the electret article to accept and hold electrostatic charges.

Electrets that comprise nonwoven polymeric fibrous webs for respiratory filters typically have a "basis weight" of about 2 to 500 grams per square meter (g/m$^2$), more typically about 20 to 150 g/m$^2$. The basis weight is the mass per unit area of filter web. The thickness of such nonwoven polymeric fibrous web is typically about 0.25 to 20 millimeters (mm), more typically about 0.5 to 2 mm. Multiple layers of fibrous electret webs are commonly used in filter elements. The solidity of the fibrous electret web typically is about 1 to 25%, more typically about 3 to 10%. Solidity is a unitless parameter that defines the solids fraction in the article.

The inventive electret articles may be used as filters in filtering face masks or other air-filtering personal respiratory protection devices, which are adapted to cover at least the nose and mouth of a wearer. The inventive electret articles also can be used in filter cartridges for half- and full-face respirators.

FIG. 3 illustrates an example of a filtering face mask 30 that may be constructed to contain an electrically-charged nonwoven web that is produced according to the present invention. The generally cup-shaped body portion 32 may be molded into a shape that fits over the nose and mouth of the wearer. The body portion 32 is porous so that inhaled air can pass through it. The electret filter medium is disposed in the mask body 32 (typically over substantially the whole surface area) to remove contaminants from the inhaled air. A conformable nose clip 33 may be placed on the mask body to assist in maintaining a snug fit over the wearer's nose. The nose clip can be an "M-shaped" clip as described in U.S. Pat. Des. 412,573 and U.S. Pat. No. 5,558,089 to Castiglione. A strap or harness system 34 may be provided to support the mask body 32 on the wearer's face. Although a dual strap system is illustrated in FIG. 1, the harness 34 may employ only one strap 36, and it may come in a variety of other configurations—see, for example, U.S. Pat. No. 4,827,924 to Japuntich et al., U.S. Pat. No. 5,237,986 to Seppalla et al., U.S. Pat. No. 5,464,010 to Byram, U.S. Pat. No. 6,095,143 to Dyrud et al., and U.S. Pat. No. 6,332,465 to Xue et al. An exhalation valve can be mounted to the mask body to rapidly purge exhaled air from the mask interior—see U.S. Pat. Nos. 5,325,892, 5,509,436, 6,843,248, 6,854,463, 7,117,868, and 7,311,104 to Japuntich et al.; U.S. Pat. RE37,974 to Bowers; and U.S. Pat. Nos. 7,013,895, 7,028,689, and 7,188,622 to Martin et al.

FIG. 4 illustrates an example of a cross-section of a mask body 32. Mask body 32 may have a plurality of layers, as indicated by numerals 38, 40, and 42. The electret filter media may be supported by other layers, such as shaping layers that are made from thermally bonded fibers, such as bicomponent fibers that have an outer thermoplastic component that enables the fibers to bond to other fibers at points of fiber intersection. Layer 38 can be an outer shaping layer, layer 40 may be a filtration layer, and layer 42 may be an inner shaping layer. Shaping layers 38 and 42 support filtration layer 40 and provide shape to mask body 32. Although the term "shaping layers" is used in this description, shaping layers also may have other functions, which in the case of an outermost layer may even be a primary function, such as protection of the filtration layer and prefiltration of a gaseous stream. Also, although the term "layer" is used, one layer may in fact comprise several sublayers, assembled to obtain desired thickness or weight. In some embodiments only one, generally inner, shaping layer is included in a face mask, but shaping may be accomplished more durably and conveniently if two shaping layers are used, for example, one on each side of the filtration layer as shown in FIG. 2. Shaping layer examples are described in the following patents: U.S. Pat. No. 4,536,440 to Berg, U.S. Pat. No. 4,807,619 to Dyrud et al., U.S. Pat. No. 5,307,796 to Kronzer et al., U.S. Pat. No. 5,374,458 to Burgio, and U.S. Pat. No. 4,850,347 to Skov. Although the illustrated mask body shown in FIGS. 1 and 2 has a generally round, cup-shaped configuration, the mask body may have other shapes—see for example U.S. Pat. No. 4,883,547 to Japuntich. Further, the mask body may comprise an inner and/or outer cover web to provide a smooth and comfortable contact with the wearer's face and/or to preclude fibers from the shaping and filtration layers from coming loose from the mask body—see U.S. Pat. No. 6,041,782 to Angadjivand et al. The respiratory mask also may have a flat-folded mask body (rather than a molded mask body)—see, for example, U.S. Pat. No. 6,394,090 to Chen and U.S. Pat. No. 6,484,722 to Bostock et al.

Nonwoven melt-blown microfiber webs useful in the present invention may be prepared using, for example, an apparatus as shown in FIG. 5. Such an apparatus includes a die 50 that has an extrusion chamber 51 through which liquefied fiber-forming material is advanced. Die orifices 52 may be arranged in line across the forward end of the die and through which the fiber-forming material is extruded. A gas, typically heated air, may be forced at high velocity through cooperating gas orifices 53. The high velocity gaseous stream draws out and attenuates the extruded fiber-forming material, whereupon the fiber-forming material solidifies as microfibers during travel to a collector 54 to form web 55.

When staple fibers are present in the web, they may be introduced through use of a lickerin roll 56 disposed above the microfiber blowing apparatus as shown in FIG. 5. A web 57 of staple fibers, typically a loose, nonwoven web such as prepared on a garnet or RANDO-WEBBER apparatus, is propelled along table 58 under drive roll 59 where the leading edge engages against the lickerin roll 56. The lickerin roll 56 picks off fibers from the leading edge of web 57, separating the fibers from one another. The picked fibers are conveyed in an air stream through an inclined trough or duct 60 and into the stream of blown microfibers where they become mixed with the blown microfibers. When particulate matter is to be introduced into the web it may be added using a loading mechanism similar to duct 60. In addition to melt-blowing techniques, fibrous webs suitable for filtration applications can be made using other methods such as spun-bond manufacturing processes. Further, nanofibers could be used in the filter media in connection with the present invention—see, for example, U.S. Patent Application 61/017,994 to Eaton et al., entitled Fluid Filtration Articles And Methods Of Making And Using Same.

The electret charge can be imparted to the polymeric articles using various known (or later developed) apparatus and methods including hydrocharging systems. Documents that describe known hydrocharging systems include U.S. Pat. Nos. 5,496,507, 6,119,691, 6,375,886, and 6,783,574 to Angadjivand et al., U.S. Pat. No. 6,406,657 to Eitzman et al., and U.S. Pat. No. 6,743,464 to Insley et al.

Hydrocharging methods deposit both positive and negative charge onto the fibers such that the positive and negative charge is randomly dispersed throughout the web. Random charge dispersal tends to produce an unpolarized web. Thus, a nonwoven fibrous electret web produced by charging with a polar liquid like water may be substantially unpolarized in a plane normal to the plane of the web. Fibers that have been charged in this manner ideally exhibit the charge configuration shown in FIG. 5C of U.S. Pat. No. 6,119,691 to Angadjivand et al. If the fibrous web also is subjected to a corona treatment operation, it would exhibit a charge configuration similar to the configuration shown in FIG. 5B of that patent. A web, formed from fibers charged solely using hydrocharging, typically has unpolarized trapped charge throughout the volume of the web. "Substantially unpolarized trapped charge" refers to a fibrous electret web that exhibits less than 1 µC/m$^2$ of detectable discharge current using thermally-simulated discharge current (TSDC) analysis, where the denominator is the electrode surface area. This charge configuration can be shown by subjecting the web to TSDC. One example of a useful hydrocharging process includes impinging jets of water or a stream of water droplets onto the article at a pressure and for a period sufficient to impart a filtration enhancing electret charge to the web, and then drying the article—see U.S. Pat. No. 5,496,507 to Angadjivand et al. The pressure necessary to optimize the filtration enhancing electret charge imparted to the article will vary depending on the type of sprayer used, the type of polymer from which the article is formed, the type and concentration of additives to the polymer, and the thickness and density of the article. Pressures in the range of about 10 to about 500 psi (69 to 3450 kPa) are generally suitable. The jets of water or stream of water droplets can be provided by any suitable spray device.

Suitable spray means for use in the method of the present invention include nebulizers where the aqueous liquid, provided through fluid line, and pressurized air, provided through air line, are supplied to a nozzle to provide a spray mist to impact the article-to-be-charged and pump action sprayers where a pump handle forces liquid provided by the supply means through the nozzle to provide a spray mist. Further description of this method of providing water contact is provided in U.S. Pat. No. 6,119,691 to Angadjivand et al. Alternatively, the article to be charged can be contacted with aqueous liquid using a variety of other methods, including those described in U.S. Pat. No. 6,406,657 to Eitzman et al., U.S. Pat. No. 6,375,886 to Angadjivand et al., U.S. Pat. No. 6,454,986 to Eitzman et al., and U.S. Pat. No. 6,824,718 to Eitzman et al.

Hydrocharging may be carried out by contacting the web with an aqueous liquid sufficient to provide the web with filtration enhancing electret charge. The pH and conductivity of the aqueous liquid may be selected based on the zeta potential of the article—see U.S. patent application Ser. No. 12/131,770 to Sebastian at al. The aqueous liquid contact may be achieved by spraying, soaking, condensing, etc., the aqueous liquid on the polymeric fibrous web to be charged. If a sprayer is used, the pressure necessary to achieve optimum results may vary depending on the type of sprayer used, the type of polymer from which the article is formed, the thickness and density of the article, and whether pretreatment such as corona discharge treatment was carried out before hydrocharging. Generally, pressures in the range of about 10 to 500 psi (69 to 3450 kPa) are suitable. The aqueous liquid may be selected to have a conductivity of about 5 to 9,000 microS/cm, when the zeta potential of the article is −7.5 mV or less. When the zeta potential is greater than −7.5 mV, then the contacting liquid may have a conductivity of about 5 to 5,500 microS/cm. Under either situation, the conductivity typically would be about 7 to 3,000 microS/cm, and still more typically about 10 to 1,000 microS/cm. Distilled or deionized water is preferable to tap water. The aqueous liquid may be purified water, made through, for example, distillation, reverse osmosis, or deionization rather than simply tap water. The aqueous liquid may contain at least 40%, more typically 60%, and still more typically 80% water by volume. Preferably, the aqueous liquid will contain essentially 100% water by volume.

Corona pretreatment or post-treatment also may be used to charge the webs alone or in conjunction with the hydrocharging systems described above—see U.S. Pat. RE 30,782; 31,285 and 32,171 to van Turnhout, and U.S. Pat. Nos. 4,375,718 and 5,401,446 to Wadsworth et al., U.S. Pat. No. 4,588,537 to Kasse et al., and U.S. Pat. No. 4,592,815 to Nakao.

EXAMPLES

Test Methods
Quality Factor (QF) Testing Method

The samples were tested for % DOP aerosol penetration (% Pen) and pressure drop ($\Delta P$), and the Quality Factor (QF) was calculated. The filtration performance (% Pen and $\Delta P$) of the nonwoven microfiber webs were evaluated using an Automated Filter Tester AFT Model 8130 (available from TSI, Inc., St. Paul, Minn.) using dioctylphthalate (DOP) as the challenge aerosol. The DOP aerosol is nominally a monodisperse 0.3 micrometer mass median diameter having an upstream concentration of 70-125 mg/m$^3$. The aerosol was forced through a sample of filter medium at a calibrated flow rate of 42.5 liters/minute (face velocity of 6.9 cm/s) with the aerosol TSI Model 8113 Aerosol Neutralizer turned off. The total testing time was 23 seconds (rise time of 15 seconds, sample time of 4 seconds, and purge time of 4 seconds). Simultaneously with % Pen, the pressure drop ($\Delta P$ in mm of water) across the filter was measured by the instrument. The concentration of DOP aerosol was measured by light scattering both upstream and downstream of the filter media using calibrated photometers. The DOP % Pen is defined as: % Pen=100×(DOP concentration downstream/ DOP concentration upstream). For each material, typically 7 to 9 separate measurements were made at different locations on the BMF web, and the results were averaged.

The % Pen and $\Delta P$ were used to calculate a QF by the following formula:

$$QF=\ln(\% \text{ Pen}/100)/\Delta P.$$

where ln stands for the natural logarithm. A higher QF value indicates better filtration performance and decreased QF values effectively correlate with decreased filtration performance.

X-ray Discharge Test

The Quality Factor and % Penetration of sample webs to be tested were determined before exposure to X-ray radiation using the test method described above. The Initial Quality Factor is designated as "$QF_0$". The sample web was exposed on each side to x-rays using the system described below, ensuring that the entire sample was uniformly exposed to the x-ray radiation. After x-ray exposure, the filter medium sample was tested again to measure its filter performance (QF and % Pen). The procedure was repeated after 5 minutes of x-ray exposure, after 30 minutes of x-ray exposure, and after 60 minutes of x-ray exposure. The % Penetration Ratio (% Pen Ratio) is also reported. The % Pen Ratio was calculated from the % Pen at 0 minutes and 60 minutes using the equation where ln stands for the natural logarithm:

$$\% \text{ Pen Ratio} = \frac{\ln(\% \text{ Pen}(0 \text{ min})/100)}{\ln(\% \text{ Pen}(60 \text{ min})/100)} \times 100\%.$$

X-ray exposure was carried out using a Baltograph 100/15 CP (Balteau Electric Corp., Stamford, Conn.) X-ray exposure system consisting of a constant potential end grounded generator rated at 100 KV at 10 mA with a beryllium window (0.75 mm inherent filtration) with an output of up to 960 Roentgen/min at 50 cm from the focal spot of 1.5 mm×1.5 mm. The voltage was set to 80 KV, with a corresponding current of 8 mA. A sample holder was set up at an approximate distance of 57.2 centimeters (22.5 inches) from the focal spot to produce an exposure of about 580 Roentgen/min.

Q9 Aging Test (100° C. for 9 Hours)

To assess the thermal stability of the charged filter medium, samples are placed in an oven at 100° C. for 9 hours then tested by the method described under Quality Factor Testing Method. The samples were tested for % DOP aerosol penetration (% Pen) and pressure drop ($\Delta P$), and the aged Quality Factor (Q9) was calculated. This Q9 data is compared with % DOP aerosol penetration (% Pen) and pressure drop ($\Delta P$), and Quality Factor (QF) collected on web samples made under the same conditions but stored at ambient conditions instead of 100° C. Typically seven to nine samples of each example were tested, and the results were averaged.

Q100 Test

While it is desirable to have a high degree of thermal stability in the filtration performance, another valuable property of fluorinated electret media is its superior performance against an oily mist aerosol. Test samples of the example webs were tested in a similar fashion to that used in the Filtration Testing Method, except that the sample is exposed continuously to the flow of DOP aerosol until the sample has been exposed to at least 100 mg of DOP aerosol. The samples tested are in the form of 5.25 inch disks with 4.5 inch diameter circular sections exposed to the aerosol. The samples are weighed before and after to check the exposures. With the measured % Pen, known flow rate time of exposure, and initial and final weights of the sample, the actual DOP exposure can be calculated. Throughout the DOP exposure the % Pen and $\Delta P$ are monitored by a computer at about 60 second intervals. A useful point in the exposure is 100 mg of DOP because it is one of the points of interest in having a two cartridge respirator meet the NIOSH 42CFR-84 certifications for R and P type respirators. From this data Q100 is calculated by picking the first data point after a sample exposure to 100 mg of DOP and selecting the value of % DOP penetration at this point as % Pen at 100 mg (% Pen@100). From this and the $\Delta P$ measured at the beginning of the test we can calculate Q100 by $$Q100=-\ln(\% \text{ Pen}@100/100)/\Delta P.$$

In order to usefully compare samples, it is desirable that the starting pressure drop ($\Delta P$) be similar between samples.

Method for Determining Surface Concentration of Fluorine Using X-ray Photoelectron Spectroscopy (XPS)

X-ray photoelectron spectroscopy (XPS) is a surface analysis technique that uses a beam of soft x-rays (Al K$\alpha$, 1486.6 eV) as a probe. The x-rays irradiate the material to generate photoelectrons that are characterized by their kinetic energy and intensity. The kinetic energies of the photoelectrons can provide quantitative information concerning the elements and their chemical states. XPS probes the outermost ~30 to 100 Å of a sample surface. It is sensitive to essentially all elements except hydrogen and helium, with detection limits down to approximately 0.1 atomic %.

XPS measurements were carried out on the sample materials using a Kratos Axis Ultra Spectrometer (Kratos Analytical, Manchester, England), which spectrometer was equipped with a monochromatic Al Kα x-ray excitation source and a spherical mirror analyzer. The spectrometer had an x-ray power equal to or near 120 Watts (W) (10 kV, 12 mA). The photoelectron take-off angle for all recorded spectra was 90 degrees, measured with respect to the sample surface. The Kratos system has a sampling area of approximately 800 micrometers (μm)×600 μm. The pressure in the vacuum system during analysis was at or below $7.0 \times 10^{-6}$ Pascals (Pa).

Using the XPS method, wide scan surveys were obtained from the sample materials. A wide scan survey spectrum contains photoelectron peaks that are characteristic of the elements present on the surface of the material. The surface composition (in atomic %) is derived from the relative areas of the core-level photoelectron peaks, with linear background subtraction and corrections to account for the instrument's atomic sensitivity factors. The Kratos spectrometer's performance was verified by analysis of a poly(tetrafluoroethylene) (PTFE) sample, which showed experimental values of atomic % fluorine (APF)=65-67 and atomic % carbon=33-35. These values are in excellent agreement with the PTFE theoretical stoichiometry.

Typical instrumental settings that were used are given in Table 1 below:

TABLE 1

| | Analysis | | | |
|---|---|---|---|---|
| Pass Energy (eV) | Scan Length (eV) | eV/ data point (eV) | Time/ data point (ms) | Number of Sweeps |
| Survey 160 | 0 to 1100 | 0.4 | 65 or 87 | 5 or 6 |

Method for Determining $C_3F_4H^+/C_2F_5^+$ Ratio Using ToF-SIMS:

Time-of-flight secondary ion mass spectrometry (ToF-SIMS) is a surface analysis technique in which a pulsed beam of kilovolt energy ions (primary ions) is used to bombard a specimen, resulting in sputtering of its surface. During sputtering, neutral and ionized atomic and molecular species are emitted from the surface. The ionized species are referred to as "secondary ions" to distinguish them from the bombarding primary ions. Secondary ions of one polarity are accelerated in an electric field to a mass spectrometer, where they travel through a flight tube and arrive at the detection and counting system. As a result of the fragments departing from the sample surface at the same time, and being subject to the same accelerating voltage, the lighter fragments arrive at the detection system before the heavier ones. The "time-of-flight" of a fragment is proportional to the square root of its mass, so that different masses are separated during the flight and can be detected individually. The quantity measured in the analysis is the fragment mass divided by the charge amount on the fragment (m/z).

ToF-SIMS analysis was performed on samples using an ION-TOF, Gmbh (Münster, Germany) TOF.SIMS.5 instrument, with a 25 kilovolt (keV) $Bi^+$ primary ion beam rastered over a 500×500 μm sample target area. ToF-SIMS provides chemical information on the outermost 10 to 20 Å of a material and produces mass spectra in both positive and negative ion modes, extending out to a mass of 1000 atomic mass units (u) and beyond. Analysis of positive ion spectra of local-fluorinated webs and remote-fluorinated webs showed three types of ions as follows:

Pure hydrocarbon ions of type $CxHy^+$, where x and y have values of 1 or greater (examples: $C_2H_3^+$, $C_3H_5^+$)

Pure fluorocarbon ions of type $CxFy^+$, where x and y have values of 1 or greater (examples: $C_2F_5^+$, $C_3F_7^+$)

Mixed hydrofluorocarbon ions of type $CxFyHz^+$, where x, y, and z have values of 1 or greater (examples: $C_3F_4H^+$, $C_5F_4H^+$).

Figure 6:
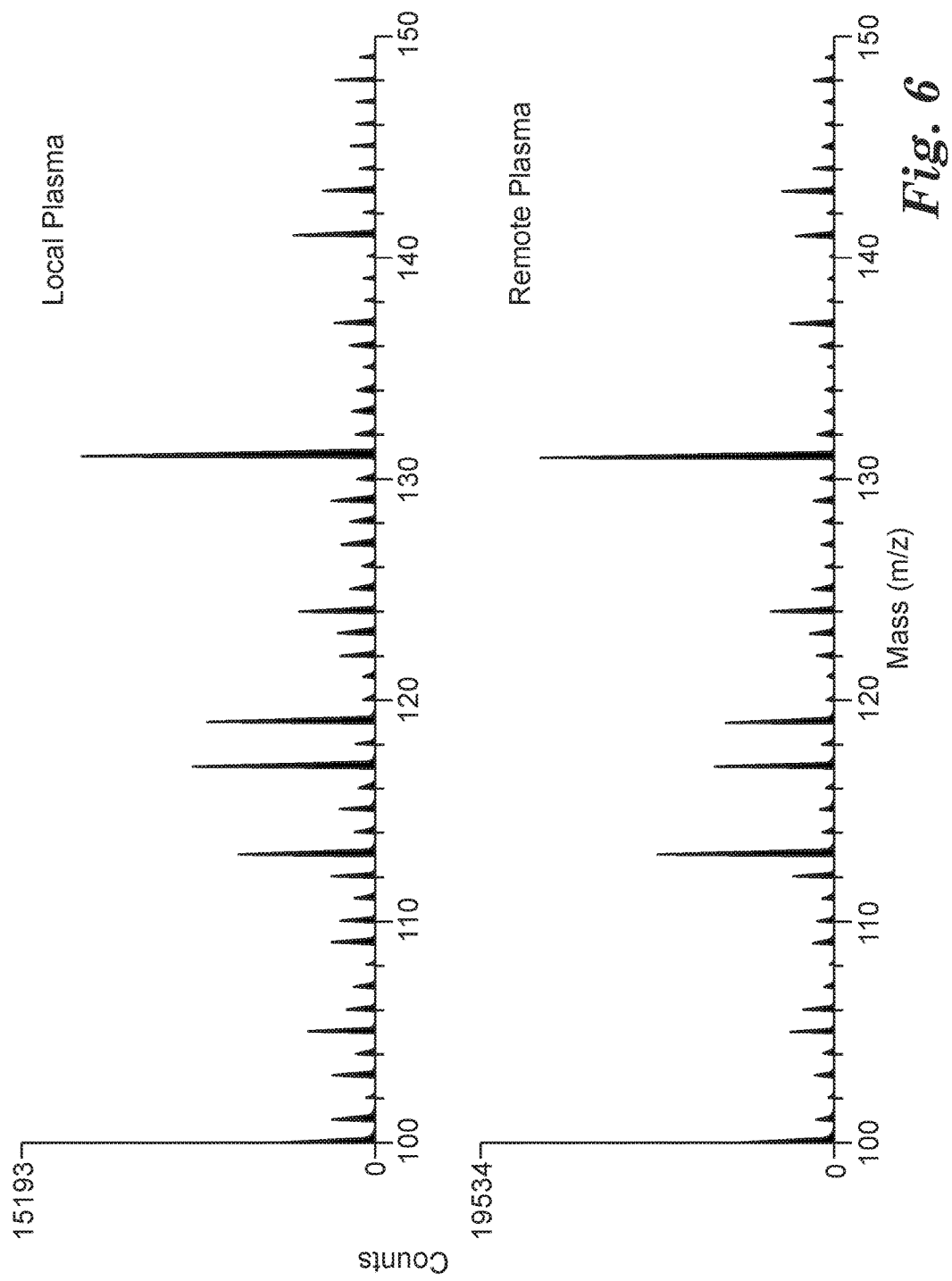
FIG. 6 illustrates ToF-SIMS spectra of locally and remotely fluorinated polypropylene blown microfiber (BMF) webs.

As an illustration of the spectra type, FIG. 6 shows ToF-SIMS spectra of two fluorinated polypropylene blown microfiber (BMF) webs, more specifically, the spectrum record for the m/z region from 100 u to 150 u. FIG. 6 shows the spectrum of a local-fluorinated web, and the spectrum of a remote-fluorinated web having approximately the same level of fluorination as the local-fluorinated web. FIG. 6 shows that there is a difference in the relative abundance of the $C_3F^4H^+$ ion at m/z 113 between the two spectra. In the material treated by remote plasma, this ion is more intense relative to its neighbors. This has been found to be a general characteristic of remote plasma treatment. For local and remote plasma-fluorinated materials having similar fluorination levels, as measured by XPS, the ToF-SIMS spectrum of the remote-treated material will show a higher relative abundance of $C_3F_4H^+$.

In ToF-SIMS, it is convenient to use a reference ion to make relative quantitative comparisons between spectra. The ratio [integrated counts of the ion of interest]/[integrated counts of the reference ion] provides a basis for comparison. In this case, the $C_2F_5^+$ fluorocarbon ion at m/z 119 provides a suitable reference ion. Table 2 contains a relative comparison of the abundance of the $C_3F_4H^+$ ion for a series of local and remote plasma-fluorinated BMF webs, together with the atomic % F as determined by XPS. The ToF-SIMS peak integration ranges were 112.5 u to 113.5 u for m/z 113, and 118.5 u to 119.5 u for m/z 119.

Local Plasma Treatment Examples 1-9

A roll of nonwoven meltblown microfiber web having a nominal basis weight of 65 grams/m², an Effective Fiber Diameter of 7.5 micrometers, a web solidity of 6%, and a width of about 50 inches was used. The polypropylene resin used to make the web was Total PP3941W available from Total Petrochemicals USA, Houston Tex.

For Local Plasma Treatment Examples 1-9, the webs were transported through a plasma by a roll-to-roll web conveying system within a vacuum chamber. The vacuum chamber contained large-area flat-plate electrodes spaced 25.4 mm apart, and a simple speed-controlled system transported a continuous web from a source roll, through the center of the space between the electrodes, to a collection roll. The total down-web path length for the web between the electrodes was 91 cm. Compressed $F_2$ gas (Air Products, >97% purity) and argon (Oxygen Service Co. St. Paul Minn., industrial grade, <5 ppm $O_2$, <10 ppm $H_2O$) were metered through separate mass flow control devices and then combined in a gas manifold. The gas mixture was introduced through an array of 1.6 mm diameter exit holes located across the face of each plate electrode. The electrodes were connected to a 13.56 MHz power supply (RF Power Products Inc., Model RFSOSWC) coupled through a matching network (RF Power Products Inc., Model 7621020020) in order to sustain the plasma. The power supply was operated at a level that provided 0.18 Watts/cm² of electrode area or 0.07 Watts/cm³ of plasma volume. The treatment chamber was evacuated using a vacuum pump stack, consisting of a Roots blower and a mechanical "dry" pump.

For the reported local plasma experiments, the reactor was typically evacuated to a base pressure of not greater than approximately 3 Pascals (Pa). The $F_2$/argon gas mixture was then introduced to the chamber at total flow rate of 8 liters/minute, which produced a steady pressure of approximately 67 Pa during the execution of each experiment. Approximately 15 m of web was treated in each condition before a representative sample was collected.

Remote Plasma Treatment Examples 1, 3-6

For Remote Plasma Treatment Example 1 and Examples 3-6, the webs were treated using the same vacuum chamber and web transport system that was used for the local plasma treatments. For these remote plasma treatments, the flat-plate electrodes were removed and the 13.56 MHz power supply was disconnected. A remote plasma source (Astron hf-s model from MKS Instruments, Andover Mass.) was mounted on the outside of the vacuum chamber and the output of this source was connected to a port on the vacuum chamber. On the interior side of the vacuum chamber, stainless steel tubing was connected to the inlet port and to both ends of two slotted reactive fluorine distribution manifolds (RFDM). The RFDM system consisted of two 1-inch diameter aluminum tubes each with a row of 0.0156×0.6875 inch slots spaced 0.0625 inches apart. The tubes were mounted approximately 5 inches away on the same side of the target web, with the slot surface normal opposing and parallel to the web surface normal. Compressed $NF_3$ gas (Advanced Specialty Gases, Reno Nev.) was metered through a mass flow control system and introduced to the inlet of the remote plasma source. When activated, the remote plasma source had an operating power level between 6600 and 7500 Watts.

For the reported remote plasma experiments, the reactor was typically evacuated to a base pressure of not greater than approximately 3 Pascals (Pa). The $NF_3$ gas was then introduced to the remote plasma source at total flow rate of 4.8 liters/minute, which produced a steady pressure of approximately 53 Pa during the execution of each experiment. Approximately 15 m of web was treated in each condition before a representative sample was collected.

Remote Plasma Treatment Example 2

For Remote Plasma Treatment Example 2, the web was treated as in Remote Plasma Treatment Example 1, with the following exceptions. For Remote Plasma Treatment Example 2 a remote plasma sources (Xstream 3151806 model from Advanced Energy Fort Collins Colo.) was mounted on the outside of the vacuum chamber and the output of this source was connected to a port on the vacuum chamber. On the interior side of the vacuum chamber, the RFDM system consisted of two 2-inch diameter aluminum tubes each with a row of 0.062×0.625 inch slots spaced 0.125 inch apart and the tubes were placed approximately 4 inches away from opposite sides of the target web, with the slot surface normal opposing and parallel to the web surface normal.

Sample Charging Procedure

After the webs were fluorinated, samples about 30 cm. wide were cut cross-web. These cross-web samples were hydrocharged by directing a fine spray of distilled water at the web from a pair of nozzles operating at a pressure of about 790 kiloPascals (kPa) (115 psig). The distilled water was delivered to the webs using Teejet Model 9501 spray heads available from Spraying Systems; Wheaton, Ill. Spray heads were placed 10 cm apart and 10 cm away from the webs and operated at a pressure of about 790 kPa. Webs passed under the spray heads at a rate of 5.1 cm/sec while a vacuum was applied to a slot positioned opposite the spray heads under the open mesh carrier belt. Located under the conveying belt opposite the spray heads was a vacuum slot, 25 cm long and 0.5 cm wide that was attached to a Dayton Electric wet dry vacuum, model 2Z9748 (Dayton Electric, Chicago, Ill.). Each sample web was run through the hydrocharger twice (sequentially once on each side) while spraying, and then twice without spraying with just the vacuum to remove any excess water. The webs were allowed to dry completely in air overnight before filter testing.

TABLE 2

X-Ray Discharge Data

| Sample # | QF | % Pen at 30 | % Pen at 60 | QF at 60 min | % Pen Ratio |
|---|---|---|---|---|---|
| Local example 1 | 1.96 | 63.90 | 73.20 | 0.11 | 1883 |
| Local example 2 | 2.07 | 43.80 | 58.00 | 0.17 | 1252 |
| Local example 3 | 2.08 | 42.90 | 67.60 | 0.13 | 1699 |
| Local example 4 | 2.28 | 52.40 | 56.80 | 0.19 | 1248 |
| Local example 5 | | | | | |
| Local example 6 | | | | | |
| Local example 7 | 2.41 | 5.19 | 25.60 | 0.43 | 584 |
| Local example 8 | 2.37 | 8.64 | 28.60 | 0.36 | 663 |
| Local example 9 | 2.44 | 5.82 | 22.40 | 0.53 | 473 |
| Remote example 1 | | | | | |
| Remote example 2a | | | | | |
| Remote example 2b | | | | | |
| Remote example 3 | 2.27 | 17.20 | 42.10 | 0.26 | 868 |
| Remote example 4 | 2.39 | 8.61 | 27.80 | 0.39 | 634 |
| Remote example 5 | 2.38 | 5.89 | 19.70 | 0.48 | 513 |
| Remote example 6 | 2.30 | 16.90 | 36.40 | 0.34 | 683 |

The data in Table 2 show that the samples exhibit suitable levels of electric charge when compared to comparative samples of known techniques. Some of the better samples still had significant levels of electret enhanced filtration, i.e., QF at sixty minutes is greater than 0.2 (mm of $H_2O)^{-1}$ even after 60 minutes of x-ray exposure.

Surface Analysis and Performance Results

The samples were tested to measure the atomic % fluorine, the $C_3F_4H^+:C_2F_5^+$ ratio, QF, Q9, and Q100. Data are presented below in Table 3:

TABLE 3

| Sample # | Web speed (ft/min) | XPS % F | ToF-SIMS C3F4H+/ C2F5+ | QF | Q9 | Q100 |
|---|---|---|---|---|---|---|
| Local example 1 | 42 | 38.7 | 1.663 | 1.99 | 1.32 | 0.23 |
| Local example 2 | 35 | 40 | 1.523 | 2.12 | 1.62 | 0.29 |
| Local example 3 | 28 | 40.3 | 1.361 | 2.13 | 1.42 | 0.60 |
| Local example 4 | 28 | 43 | 1.331 | 2.22 | 1.70 | 0.65 |
| Local example 5 | 28 | 47.3 | 0.781 | 2.41 | 1.98 | 1.22 |
| Local example 6 | 14 | 49 | 0.493 | 2.79 | 2.06 | 1.42 |
| Local example 7 | 14 | 49 | 0.664 | 2.35 | 1.48 | 1.25 |
| Local example 8 | 14 | 49.3 | 0.632 | 2.35 | 1.67 | 1.30 |
| Local example 9 | 7 | 52.3 | 0.317 | 2.37 | 1.59 | 1.50 |
| Remote example 1 | 51 | 43.3 | 1.695 | 2.45 | 2.04 | 1.03 |
| Remote example 2a | 51 | 43.3 | 1.691 | 1.79 | 1.60 | 0.77 |
| Remote example 2b | 51 | 45 | 1.699 | 1.79 | 1.60 | 0.77 |
| Remote example 3 | 35 | 48 | 1.365 | 2.25 | 1.78 | 0.69 |
| Remote example 4 | 28 | 50.3 | 1.403 | 2.25 | 1.76 | 1.00 |
| Remote example 5 | 14 | 55 | 0.888 | 2.29 | 1.59 | 1.39 |
| Remote example 6 | 7 | 57 | 0.949 | 2.18 | 1.84 | 1.44 |

The date in Table 3 compare surface analysis for samples treated by comparative local plasma and the remote plasma fluorination processes. The data in this table show that the two plasma treatment techniques produce web that has similar performance in the QF testing but have distinctly different surface character seen in the ToF-SIMS and XPS analysis.

Figure 7:
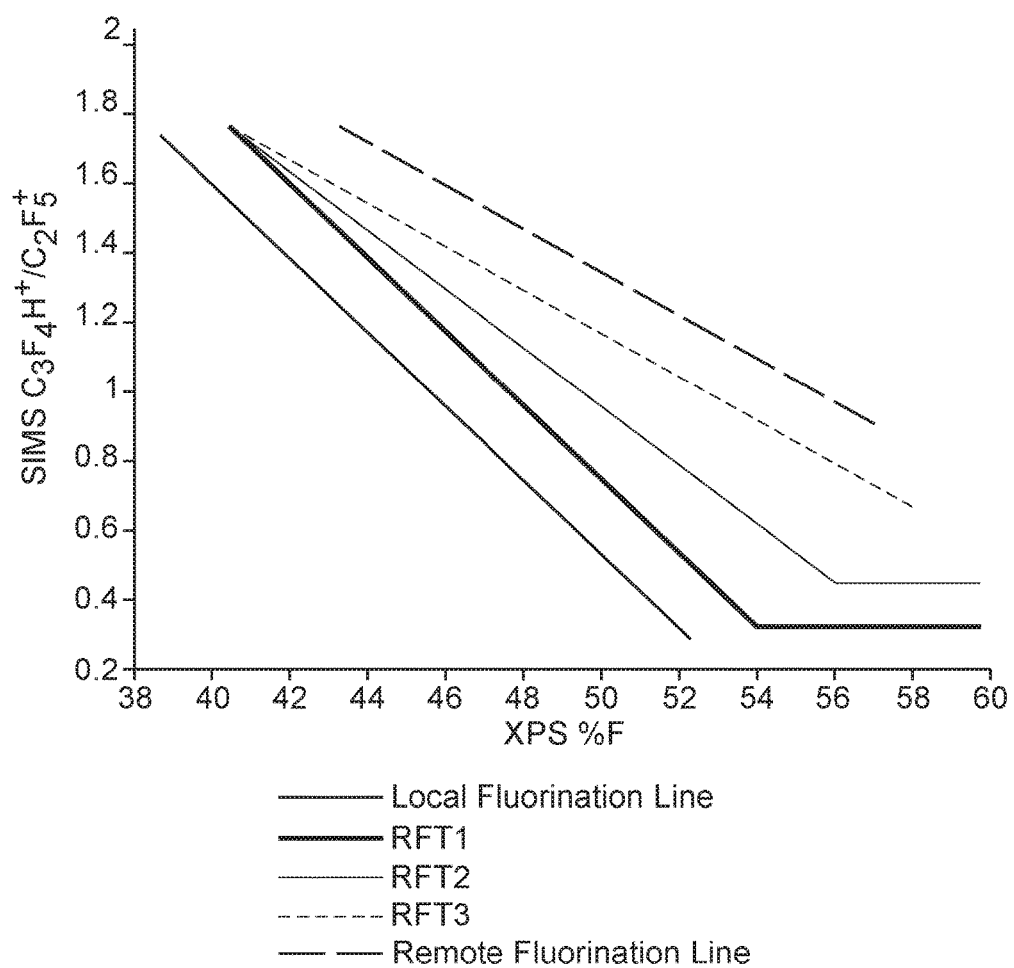
FIG. 7 is a graph of the SIMS $C_3F_4H^+$ to $C_2F_5^+$ ratio to atomic % fluorine.

FIG. 7 shows a plot of XPS % F vs. ToF-SIMS $C_3F_4H^+/C_2F_5^+$ ratio data. A regression line has been plotted through the local plasma points to give the Local Fluorination Line. Similarly, a regression line has been plotted through the remote plasma points to give the Remote Fluorination Line. The $R^2$ value (a measure of goodness-of-fit, where $R^2=1$ for a perfect fit) for the Local Fluorination Line is 0.985, and the equation of the line is y=−0.1037x+5.7098.

The $R^2$ value for the Remote Fluorination Line is 0.940, and the equation of the line is y=−0.0610x+4.364.

To distinguish between webs fluorinated locally or remotely, three Remote Fluorination Threshold (RFT) lines have been constructed from the ratio and atomic % fluorine data, as illustrated in FIG. 7. Line RFT1 runs parallel to the Local Fluorination Line and has the following equation:

$$y=-0.1037x+5.9188. \quad (1)$$

At a fluorination level above 54% F, line RFT1 takes on a constant value of y=0.32. The additional offset on line RFT1 is based on statistical prediction of the maximum likely value for a local-fluorinated web at a given % F level. BMF webs having a $C_3F_4H^+/C_2F_5^+$ ratio that falls above the RFT1 line at a given % F are distinguishable from webs that were fluorinated locally.

Line RFT3 runs parallel to the Remote Fluorination Line and has the following equation:

$$y=-0.0610x+4.191. \quad (3)$$

The negative offset on line RFT3 is based on statistical prediction of the minimum likely value for a remote-fluorinated web at a given % F level. For a BMF web having a $C_3F_4H^+/C_2F_5^+$ ratio that falls above the RFT3 line at a given % F, there is a very high probability that the web was fluorinated remotely.

Line RFT2 has the following equation:

$$y=-0.08235x+5.0549. \quad (2)$$

Line RFT2 is the line that bisects lines RFT1 and RFT3. At a fluorination level above 56% F, line RFT2 takes on a constant value of y=0.44. For a BMF web having a $C_3F_4H^+/C_2F_5^+$ ratio that falls above the RFT2 line at a given % F, there is a high probability that the web was fluorinated remotely.

This invention may take on various modifications and alterations without departing from its spirit and scope. Accordingly, this invention is not limited to the above-described but is to be controlled by the limitations set forth in the following claims and any equivalents thereof.

This invention also may be suitably practiced in the absence of any element not specifically disclosed herein.

All patents and patent applications cited above, including those in the Background section, are incorporated by reference into this document in total. To the extent there is a conflict or discrepancy between the disclosure in such incorporated document and the above specification, the above specification will control.

What is claimed is:

1. An electret article that comprises:
    a nonwoven web that comprises melt-blown fibers that contain polypropylene and that have fluorine atoms on the surfaces of the melt-blown fibers in the web such that the electret article has (a) an atomic % fluorine greater than 40%, (b) a ToF-SIMS $C_3F_4H^+$ to $C_2F_5^+$ ratio that is greater than 0.3 and that is above a Remote Fluorination Threshold RFT1 line for the atomic % fluorine, (c) a fluorosaturation ratio in a range of about 270 to about 413, and (d) does not contain heteroatoms.

2. The electret article of claim 1, wherein the polypropylene melt-blown fibers are microfibers that have an effective fiber diameter of 1 to 10 µm and that have a volume resistivity of $10_{14}$ ohm-cm or greater, and wherein the article exhibits a QF of at least about 2 and a Q9 of 1.5/mm H₂O.

3. The electret article of claim 2, wherein the ToF-SIMS $C_3F_4H^+$ to $C_2F_5^+$ ratio is above an RFT2 line.

4. The electret article of claim 2, wherein the ToF-SIMS $C_3F_4H^+$ to $C_2F_5^+$ ratio is above an RFT3 line.

5. A filter that comprises the electret article of claim 1.

6. A respirator that comprises the filter of claim 5.

7. The electret article of claim 1, wherein the article exhibits a Q9 of at least 1.6/mm H₂O.

8. The electret article of claim 1, wherein the article exhibits a Q9 of at least 1.8/mm H₂O.

9. The electret article of claim 1, wherein the article has an atomic % fluorine of greater than 42%.

10. The electret article of claim 1, wherein the article has an atomic % fluorine of greater than 45%.

11. The electret article of claim 1 having a ToF-SIMS $C_3F_4H^+$ to $C_2F_5^+$ ratio of at least about 0.4.

12. The electret article of claim 1 having a basis weight of 20 to 150 g/m², a solidity of 3 to 10%, and a thickness of 0.5 to 2 mm.

13. The electret article of claim 1, wherein the article has a fluorosaturation ratio of 332 or greater.

14. The electret article of claim 1, wherein the article has a fluorosaturation ratio of 372 or greater.

* * * * *